United States Patent
Li et al.

(10) Patent No.: US 10,038,437 B2
(45) Date of Patent: Jul. 31, 2018

(54) HIGH VOLTAGE POWER SYSTEM WITH ENABLE CONTROL

(71) Applicant: Wuxi Chipown Micro-electronics Limited, New District, Wuxi, Jiangsu (CN)

(72) Inventors: Haisong Li, Jiangsu (CN); Changshen Zhao, Jiangsu (CN); Yangbo Yi, Jiangsu (CN); Wenliang Liu, Jiangsu (CN); Zhijun Wu, Jiangsu (CN)

(73) Assignee: WUXI CHIPOWN MICRO-ELECTRONICS LIMITED NEW DISTRICT, Wuxi, Jiangsu (CN)

( * ) Notice: Subject to any disclaimer, the term of this patent is extended or adjusted under 35 U.S.C. 154(b) by 0 days.

(21) Appl. No.: 15/346,891

(22) Filed: Nov. 9, 2016

(65) Prior Publication Data

US 2017/0338811 A1 Nov. 23, 2017

(30) Foreign Application Priority Data

May 17, 2016 (CN) .......................... 2016 1 0325296

(51) Int. Cl.
| | |
|---|---|
| H03K 3/02 | (2006.01) |
| H03K 17/22 | (2006.01) |
| H02M 1/36 | (2007.01) |
| H03K 3/0233 | (2006.01) |
| H03K 7/08 | (2006.01) |
| H03K 19/00 | (2006.01) |
| H02M 1/00 | (2006.01) |

(52) U.S. Cl.
CPC ............ *H03K 17/223* (2013.01); *H02M 1/36* (2013.01); *H03K 3/02337* (2013.01); *H03K 7/08* (2013.01); *H03K 19/0016* (2013.01); *H02M 2001/0006* (2013.01); *H02M 2001/0032* (2013.01); *H03K 2217/0036* (2013.01); *Y02B 70/16* (2013.01)

(58) Field of Classification Search
None
See application file for complete search history.

(56) References Cited

U.S. PATENT DOCUMENTS

| | | | | |
|---|---|---|---|---|
| 2009/0278521 | A1* | 11/2009 | Omi ........................ | H02M 1/36 323/288 |
| 2011/0181264 | A1* | 7/2011 | Aiura ................... | H02M 3/1582 323/288 |

\* cited by examiner

*Primary Examiner* — Long Nguyen
(74) *Attorney, Agent, or Firm* — Gregory M. Howison

(57) ABSTRACT

Disclosed is a high voltage power system with enable control, comprising a high voltage start-up circuit, a PWM control module, and a driving module; the high voltage start-up circuit comprises a first transistor, a third transistor, a fourth transistor, a resistor, a diode, a VDD detection unit and an I/O interface unit; the high voltage start-up circuit is controlled by an input of a pin EN; when the pin EN is set, the high voltage start-up circuit stops working; the power system is shut off and doesn't restart, and enters a zero standby state; when the pin EN is reset, the high voltage start-up circuit restores to work, and the power system restarts and enters a normal working state. The power system having the high voltage start-up circuit with enable control has characteristics that the standby input power consumption and standby input current are both close to zero.

12 Claims, 2 Drawing Sheets

HIGH VOLTAGE POWER SYSTEM WITH ENABLE CONTROL

CROSS-REFERENCE TO RELATED APPLICATIONS

This application claims priority to and/or benefit from Chinese Application No. CN 201610325296.3, filed on May 17, 2016, entitled HIGH VOLTAGE POWER SYSTEM WITH ENABLE CONTROL, the specification of which is incorporated by reference herein in its entirety.

TECHNICAL FIELD

The present disclosure relates to a high voltage power system with enable control, which is applicable to switching power supply chips, and belongs to the technical field of power semiconductors.

BACKGROUND

As shown in FIG. 1, the existing high voltage start-up circuit includes a transistor M1, a resistor R1, a diode D1 and a VDD detection unit. The connection relationship between the elements is described as follows: the drain of the transistor M1 is connected with a first end of the resistor R1 and with the pin HV; the gate of the transistor M1 is connected with a second end of the resistor R1, the cathode of the diode D1, and the drain of the transistor M3; the source of the transistor M1 is connected with the input end of the VDD detection unit 101, the pin VDD, and the capacitor C1 connected with the pin VDD; the anode of the diode D1 is connected with the source of the transistor M3 and the power supply ground. The gate of the transistor M3 is connected with the output end of the VDD detection unit 101; the output end of the PWM control module 2 is connected with the input end of the driving module 3. The output end of the driving module 3 is connected with the gate of the power transistor M2; the drain of the power transistor M2 is connected with the pin SW; the source of the power transistor M2 is connected with the first end of the resistor Rs, and the second end of the resistor Rs is connected with the power supply ground. The working principle is as follows: when the power system is starting up, the transistor M1 is conductive, and a relatively large flow of current $I_{HV}$ from the pin HV of the power supply chip charges the external capacitor C1 connected with the pin VDD quickly, so as to start the power system rapidly; when the potential of the pin VDD is charged to a certain voltage threshold, the transistor M3 is conductive, and the potential of the gate of the transistor M1 is pulled low, and the transistor M1 is off; the starting process ends; the PWM control module 2 and the driving module 3 enter normal working states, the power transistor M2 starts normal operation, and the power system starts to output energy.

FIG. 2 shows the working waves of the high voltage start-up circuit above. At the instant $t_1$, the power system is powered on, and the power system enters a start-up state. The output signal VDD_OK of the VDD detection unit 101 remains a low level, and the transistor M3 is off. The current $I_{HV}$ charges the external capacitor C1 connected with the pin VDD of the power supply chip, and the charging current value is $I_1$. The voltage of the pin VDD increases gradually. In the starting process, the GATE signal output by the driving module 3 remains a low level, and the power transistor M2 remains off. At the instant $t_2$, the voltage of the pin VDD rises to a certain value, and VDD_OK is inversed to be a high level; the transistor M3 is conductive; the potential of the gate of the transistor M1 is pulled low and the transistor M1 is off, and the current $I_{HV}$ is reduced to zero. At the same time, the PWM control module 2 and the driving module 3 enter normal working states, the power transistor M2 starts normal operation, and the current $I_{VDD}$ rises from zero to a higher value of $I_2$. At the instant t3, the power enters a standby mode, and the current $I_{VDD}$ reduces to a lower value $I_3$, wherein, I2>I3>0. In the process of startup-normal operation-standby, current flowing through the resistor R1 always exists, and the current value is very small, which is close to the zero current.

In conclusion, when the power supply is in normal operation, only a smaller flow of current through the resistor R1 and only the power consumption generated by the current exist in the high voltage start-up circuit, thereby reducing the input power consumption of the power supply in normal working state. Nevertheless, as the high voltage start-up circuit and the power supply are in working states when the power system is in standby mode, the power system utilizing this high voltage start-up circuit has the problems that the standby input power consumption is rather large (over 50 mW) or the standby input current is rather large (over 300 µA), which causes energy waste, and is not suitable for occasions which require extremely low standby input power consumption or extremely low standby input current.

SUMMARY

The present disclosure aims at overcoming the defects in the prior art, and providing a high voltage power system with enable control.

The objectives of the present disclosure are achieved by the following technical schemes:

A high voltage power system with enable control comprises a high voltage start-up circuit 1, a PWM control module 2 and a driving module 3; the high voltage start-up circuit 1 comprises a first transistor M1, a third transistor M3, a fourth transistor M4, a resistor R1, a diode D1, a VDD detection unit 101 and an I/O interface unit 102; the drain of the first transistor M1 is connected with a first end of the resistor R1 and with a pin HV; a gate of the first transistor M1 is connected with a second end of the resistor R1, a cathode of the diode D1, a drain of the third transistor M3 and drain of the fourth transistor M4; a source of the first transistor M1 is connected with an input end of the VDD detection unit 101, a pin VDD and a capacitor C1 connected with the pin VDD; an anode of the diode D1 is connected with source of the third transistor M3, a source of the fourth transistor M4 and a power supply ground; a gate of the third transistor M3 is connected with an output end of the VDD detection unit 101; a gate of the fourth transistor M4 is connected with an input end of the I/O interface unit 102 and with a pin EN; an output end of the I/O interface unit 102 is connected with the PWM control module 2 and the driving module 3; an output end of the PWM control module 2 is connected with an input end of the driving module 3; an output end of the driving module 3 is connected with a gate of a power transistor M2; a drain of the power transistor M2 is connected with a pin SW; a source of the power transistor M2 is connected with a first end of a current sampling resistor Rs, and a second end of the current sampling resistor Rs is connected with the power supply ground.

Further, in the high voltage power system with enable control above, the high voltage start-up circuit 1, the PWM control module 2 and the driving module 3 are together controlled by an input of the pin EN; when the pin EN is set, the high voltage start-up circuit, the PWM control module 2 and the driving module 3 are shut off simultaneously, thereby the power system enters a zero standby state; when the pin EN is reset, the high voltage start-up circuit works, and the power system having the high voltage start-up circuit restarts and enters a normal working state.

Further, in the high voltage power system with enable control above, a set potential for setting the pin EN is a high level or a low level, and a reset potential for resetting the pin EN is opposite to the set potential.

Further, in the high voltage power system with enable control above, a condition of setting or resetting the pin EN is an input state of the power system, or an output state of the power system.

Further, in the high voltage power system with enable control above, the high voltage start-up circuit, the PWM control module 2, the driving module 3 and the power transistor M2 are integrated in a control chip of the power supply together.

Further, in the high voltage power system with enable control above, the pin HV is a separate high voltage start-up pin.

Further, in the high voltage power system with enable control above, the VDD detection unit 101 is a comparator with hysteresis thresholds, or a combination of a plurality of comparators.

Further, in the high voltage power system with enable control above, the I/O interface unit 102 is a Schmitt trigger with an input pull-up resistor or with a pull-down resistor.

Further, in the high voltage power system with enable control above, the drain of the fourth transistor M4 is an enable control end; when the enable control end is set, the high voltage start-up circuit stops working; when the enable control end is reset, the high voltage start-up circuit restores to work, and the power supply restarts; when voltage of the pin VDD rises to a certain threshold value, the PWM control module 2 and the driving module 3 work in normal state, and the power transistor M2 starts to work, and the power supply starts to output energy.

Further, in the high voltage power system with enable control above, the high voltage start-up circuit is applied in a flyback switching power supply with a primary side feedback, or applied in switching power supplies with other topologies.

The substantive features and notable progresses of the present disclosure are as follows:

1. The high voltage start-up circuit, the PWM control module and the driving module, are controlled together by the input of the pin EN. When the pin EN is set, the high voltage start-up circuit stops working. Simultaneously, the PWM control module and the driving module are shut off as well, and the power transistor remains off, and the power system having the power transistor enters a zero standby state. When the pin EN is reset, the high voltage start-up circuit starts to work, and the power system restarts and enters a normal working state. As the high voltage start-up circuit, the PWM control module and the driving module are not in working state when the pin EN is set, the standby power consumption is greatly reduced, and the power system is in a zero standby state; the power system has the characteristics that the standby input power consumption and the standby input current are both close to zero;

2. The high voltage start-up circuit is controlled to stop working or restore to work by the potential of the pin EN, which increases the application flexibility of the high voltage start-up circuit, also enables the standby power consumption and the standby input current of the power system to be extremely low.

3. The power system can realize properties of extremely low standby power consumption less than 15 mW and of extremely low standby input current less than 60 µA.

DETAILED DESCRIPTION

Figure 1:
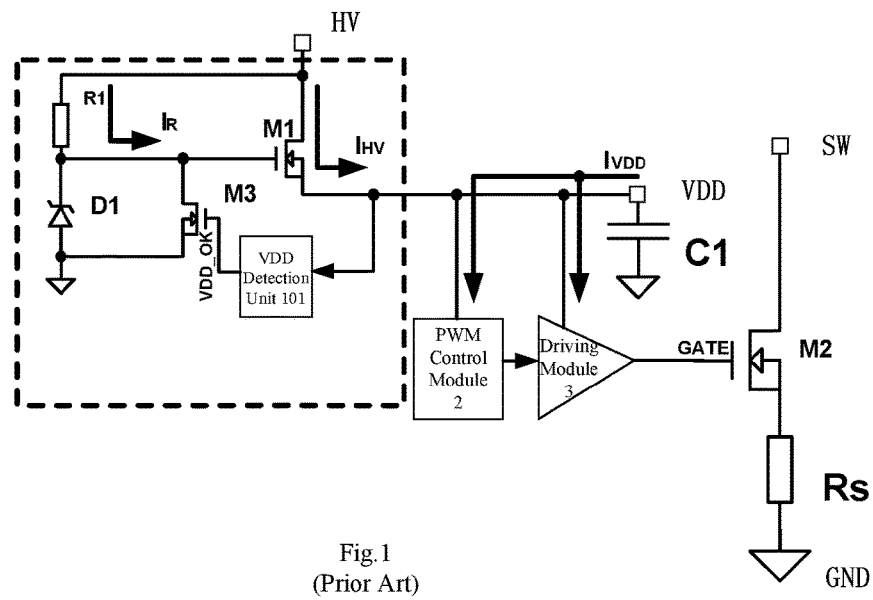
FIG. 1 is a block diagram illustrating the structure and application of the high voltage power system in the prior art.
Figure 2:
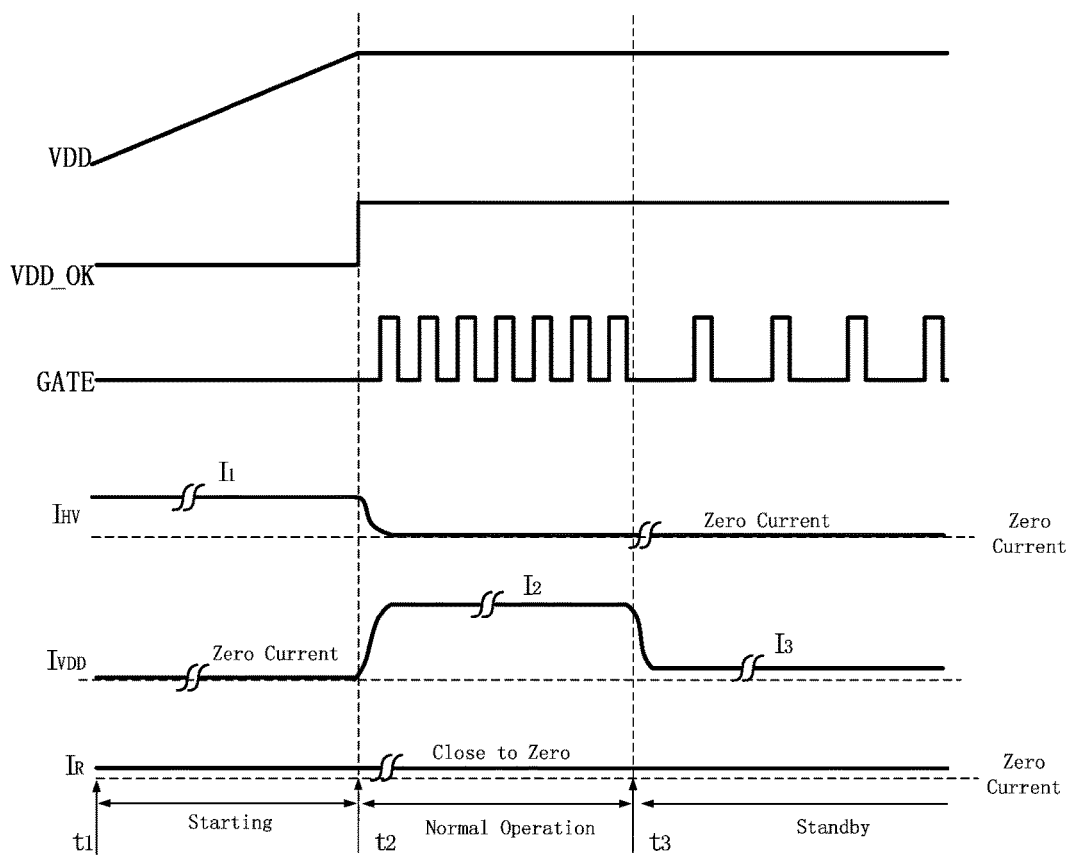
FIG. 2 is a schematic diagram illustrating the working waves of the high voltage power system in the prior art.
Figure 3:
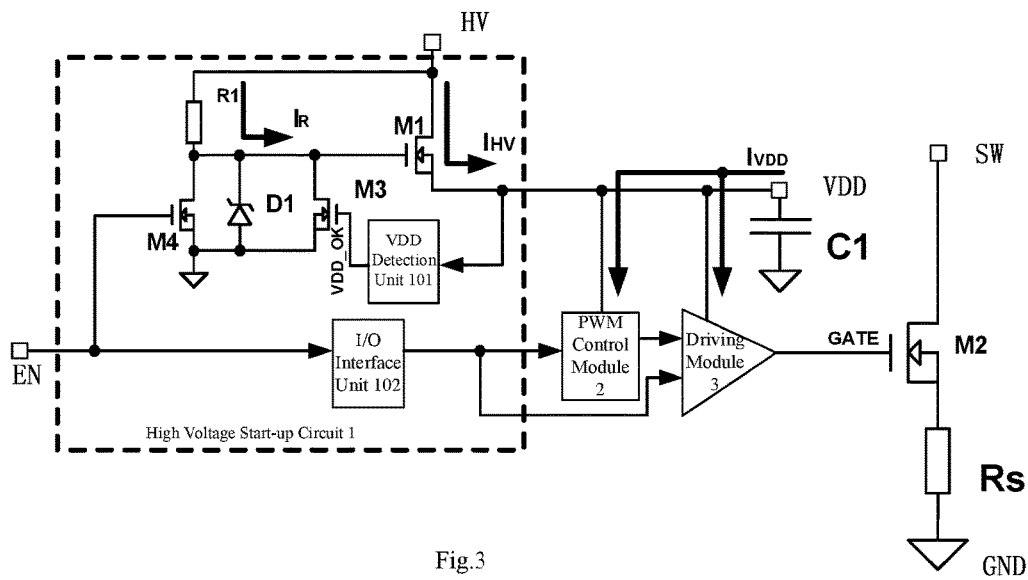
FIG. 3 is a schematic diagram illustrating the high voltage power system with enable control of the present disclosure.

As shown in FIG. 3, the high voltage power system with enable control includes a high voltage start-up circuit 1, a PWM control module 2 and a driving module 3. The high voltage start-up circuit 1 includes a first transistor M1, a third transistor M3, a fourth transistor M4, a resistor R1, a diode D1, a VDD detection unit 101 and an I/O interface unit 102. The drain of the first transistor M1 is connected with a first end of the resistor R1 and with the pin HV. The gate of the first transistor M1 is connected with a second end of the resistor R1, the cathode of the diode D1, the drain of the third transistor M3 and the drain of the fourth transistor M4. The source of the first transistor M1 is connected with the input end of the VDD detection unit 101, the pin VDD and the capacitor C1 connected with the pin VDD. The anode of the diode D1 is connected with the source of the third transistor M3, the source of the fourth transistor M4 and the power supply ground. The gate of the third transistor M3 is connected with the output end of the VDD detection unit 101. The gate of the fourth transistor M4 is connected with the input end of the I/O interface unit 102 and with the pin EN, and the output end of the I/O interface unit 102 is connected with the PWM control module 2 and the driving module 3. The output end of the PWM control module 2 is connected with the input end of the driving module 3. The output end of the driving module 3 is connected with the gate of the power transistor M2; the drain of the power transistor M2 is connected with the pin SW; the source of the power transistor M2 is connected with the first end of the current sampling resistor Rs, and the second end of the current sampling resistor Rs is connected with the power supply ground.

Wherein, the high voltage start-up circuit 1, the PWM control module 2 and the driving module 3 are together controlled by the input of the pin EN. When the pin EN is set, the high voltage start-up circuit, the PWM control module 2 and the driving module 3 are shut off simultaneously, thereby the power system enters a zero standby state. When the pin EN is reset, the high voltage start-up circuit works, and the power system having the high voltage start-up circuit restarts and enters a normal working state. The set potential is a high level or a low level, and the reset potential is opposite to the set potential.

The condition of setting or resetting the pin EN is an input state of the power system, or an output state of the power system, which increases the application flexibility of the high voltage start-up circuit and greatly reduces the standby power consumption and the standby input current of the power system as well.

The high voltage start-up circuit 1, the PWM control module 2, the driving module 3 and the power transistor M2 are integrated in the power supply control chip together.

The pin HV is a separate high voltage start-up pin and can be short connected with the pin SW.

The high voltage start-up circuit is applied in the flyback switching power supply with the primary side feedback, or applied in switching power supplies with other topologies.

The VDD detection unit 101 is a comparator with hysteresis thresholds, or a combination of a plurality of comparators.

The I/O interface unit 102 is a Schmitt trigger with an input pull-up or pull-down resistor, or may be implemented with other kinds of I/O interfaces.

The drain of the fourth transistor M4 is the enable control end. When the enable control end is set, the high voltage start-up circuit stops working; when the enable control end is reset, the high voltage start-up circuit restores working state, and the power supply restarts. When the voltage of the pin VDD rises to a certain threshold value, the PWM control module 2 and the driving module 3 work in normal state, and the power transistor M2 starts to work, and the power supply starts to output energy.

Figure 4:
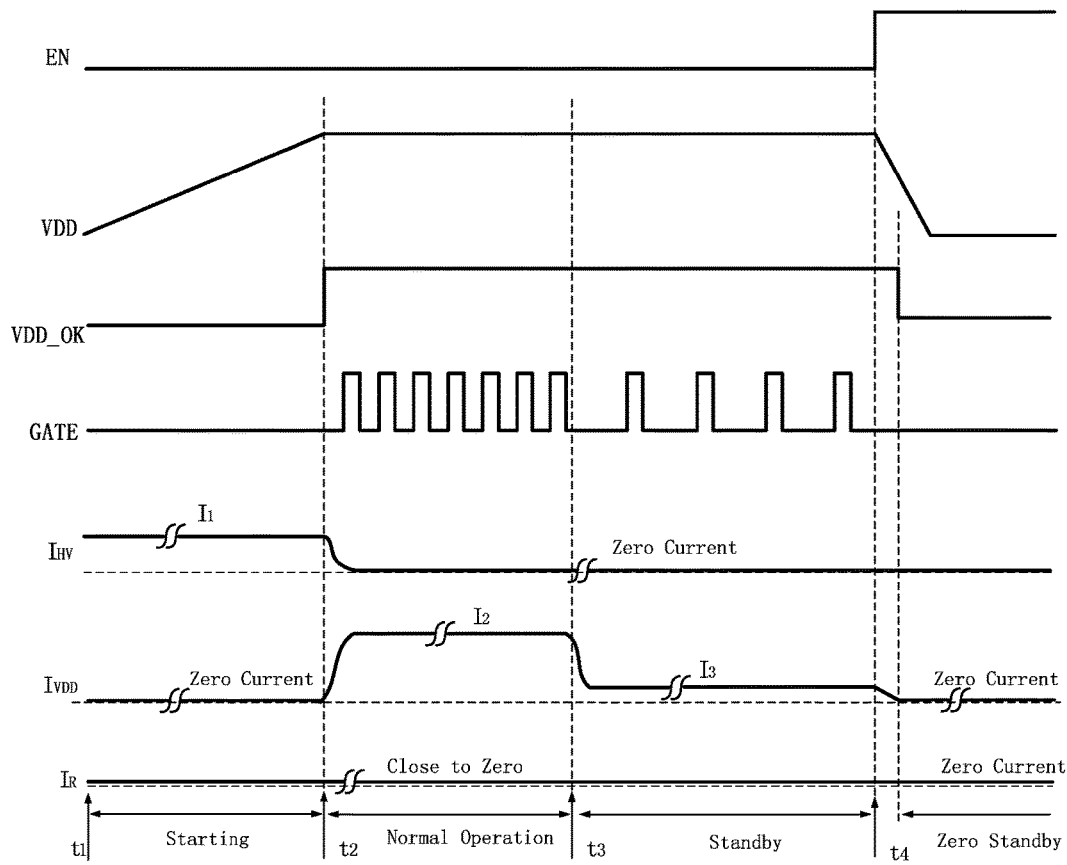
FIG. 4 is a schematic diagram illustrating the working waves of the high voltage power system with enable control of the present disclosure.

The working waves of the high voltage power system with enable control are shown in FIG. 4. At the instant $t_1$, the power system is powered on, and the potential of the pin EN is a reset potential (the low level shown in the Figure is for illustration only), and the fourth transistor M4 is off. Simultaneously, the output signal VDD_OK of the VDD detection unit 101 remains a low level, and the third transistor M3 is off; the high voltage start-up circuit starts to work, and the current $I_{HV}$ charges the external capacitor C1 connected with the pin VDD, and the charging current value is $I_1$. The voltage of the pin VDD increases gradually. In the starting process, the GATE signal output by the driving module 3 remains a low level, and the power transistor M2 remains off. At the instant $t_2$, the voltage of the pin VDD rises to a certain value, and VDD_OK is inversed to be a high level; the third transistor M3 is conductive; the potential of the gate of the first transistor M1 is pulled low and the first transistor M1 is off, and the current $I_{HV}$ is reduced to zero. At this time, the power supply chip enters a normal working state; the driving module properly outputs the signal GATE; the power transistor M2 works in normal state; and the current $I_{VDD}$ rises from zero to a higher value $I_2$. At the instant t3, the power supply enters a standby mode, and the current $I_{VDD}$ reduces to a lower value $I_3$, wherein, I2>I3>0. At the instant t4, the potential of the pin EN is inversed to be a set potential due to the change of the external conditions, and the power supply enters the zero standby state. On one hand, the PWM control module 2 and the driving module 3 are not in operation, and the signal GATE is set to be a low level and the current $I_{VDD}$ is reduced to be close to zero. On the other hand, the fourth transistor M4 is conductive, and the high voltage start-up circuit is not in operation, which ensures that power supply doesn't restart when the pin EN is set and ensures that the current $I_{HV}$ remains close to zero. In the process of startup-normal operation-standby-zero standby, the current flowing through the resistor R1 always exists, and the current value is very small, which is close to the zero current. Therefore, as compared with the input current of the power system in the standby state, the input current of the power system in the zero standby state is reduced to be close to zero, and the input power consumption is reduced to be close to zero as well.

The structure of the high voltage start-up circuit with enable control is not limited to the structure shown in FIG. 3. Any improvement may be made based on the present invention without departing from the scope of the present invention.

The power system with enable control of the present disclosure can realize the zero standby properties, namely, extremely low standby input power consumption and standby input current. For example, the power system can realize the properties of extremely low standby input power consumption lower than 15 mV and extremely low standby input current lower than 60 µA, and it is suitable for occasions which require extremely low standby input power consumption or extremely low standby input current, thereby saving energy and protecting the environment.

It should be noted that, what described above are merely preferred embodiments of the present invention, and the present invention is not restricted to the preferred embodiments. It should be understood by those skilled in the art that the preferred embodiments above can be implemented, and that other equivalent modifications or improvement made without departing from the spirits of the present invention should all be included within the scope of the present invention.

What is claimed is:

1. A high voltage power system with enable control, comprising:
   a high voltage start-up circuit (1);
   a PWM control module (2); and
   a driving module (3);
   wherein the high voltage start-up circuit (1) comprises:
   a first transistor (M1),
   a third transistor (M3),
   a fourth transistor (M4),
   a resistor (R1),
   a diode (D1),
   a VDD detection unit (101) and
   an I/O interface unit (102);
   wherein a drain of the first transistor (M1) is connected with a first end of the resistor (R1) and with a first pin (HV);
   wherein a gate of the first transistor (M1) is connected with a second end of the resistor (R1), a cathode of the diode (D1), a drain of the third transistor (M3) and a drain of the fourth transistor (M4);
   wherein a source of the first transistor (M1) is connected with an input end of the VDD detection unit (101), a pin second (VDD) and a capacitor (C1) connected with the second pin (VDD);
   wherein an anode of the diode (D1) is connected with a source of the third transistor (M3), a source of the fourth transistor (M4) and a ground of a power supply;
   wherein a gate of the third transistor (M3) is connected with an output end of the VDD detection unit (101);
   wherein a gate of the fourth transistor (M4) is connected with an input end of the I/O interface unit (102) and with a third pin (EN);
   wherein an output end of the I/O interface unit (102) is connected with an input end of the PWM control module (2) and a first input end of the driving module (3);
   wherein an output end of the PWM control module (2) is connected with a second input end of the driving module (3);

wherein an output end of the driving module (3) is connected with a gate of a power transistor (M2);

wherein a drain of the power transistor (M2) is connected with a fourth pin (SW);

wherein a source of the power transistor (M2) is connected with a first end of a current sampling resistor (Rs), and a second end of the current sampling resistor (Rs) is connected with the ground of the power supply.

2. The high voltage power system with enable control according to claim 1, wherein:

the high voltage start-up circuit (1), the PWM control module (2) and the driving module (3) are together controlled by an input of the third pin (EN);

wherein, when the third pin (EN) is set, the high voltage start-up circuit, the PWM control module (2) and the driving module (3) are shut off simultaneously, thereby the power system enters a zero standby state; and wherein, when the third pin (EN) is reset, the high voltage start-up circuit operates, and the power system having the high voltage start-up circuit restarts and enters a normal working state.

3. The high voltage power system with enable control according to claim 2, wherein a set potential for setting the third pin (EN) is a high level or a low level, and a reset potential for resetting the third pin (EN) is opposite to the set potential.

4. The high voltage power system with enable control according to claim 2, wherein a condition of setting or resetting the third pin (EN) is an input state of the power system, or an output state of the power system.

5. The high voltage power system with enable control according to claim 1, wherein the high voltage start-up circuit (1), the PWM control module (2), the driving module (3) and the power transistor (M2) are integrated in a control chip of the power supply.

6. The high voltage power system with enable control according to claim 1, wherein the first pin HV is a separate high voltage start-up pin.

7. The high voltage power system with enable control according to claim 1, wherein the VDD detection unit (101) is a comparator with hysteresis thresholds.

8. The high voltage power system with enable control according to claim 1, wherein the I/O interface unit (102) is a Schmitt trigger with an input pull-up resistor.

9. The high voltage power system with enable control according to claim 1, wherein:

the drain of the fourth transistor (M4) is an enable control end;

wherein, when the enable control end is set, the high voltage start-up circuit stops working;

wherein, when the enable control end is reset, the high voltage start-up circuit restores working state, and the power supply restarts;

wherein, when voltage of the second pin (VDD) rises to a certain threshold value, the PWM control module (2) and the driving module (3) work in normal state, and the power transistor (M2) starts to work, and the power supply starts to output energy.

10. The high voltage power system with enable control according to claim 1, wherein the high voltage start-up circuit (1) is applied in a flyback switching power supply with a primary side feedback.

11. The high voltage power system with enable control according to claim 1, wherein the VDD detection unit (101) is a combination of a plurality of comparators.

12. The high voltage power system with enable control according to claim 1, wherein the I/O interface unit (102) is a Schmitt trigger with a pull-down resistor.

* * * * *